Jan. 6, 1970 C. F. VASILE 3,488,595
ELECTRICAL APPARATUS WHICH EXHIBITS A RELATIVELY
CONSTANT TUNABLE BANDWIDTH
Filed Oct. 5, 1966

United States Patent Office
3,488,595
Patented Jan. 6, 1970

3,488,595
ELECTRICAL APPARATUS WHICH EXHIBITS A RELATIVELY CONSTANT TUNABLE BANDWIDTH

Carmine F. Vasile, Greenlawn, N.Y., assignor to Hazeltine Research Inc., a corporation of Illinois
Filed Oct. 5, 1966, Ser. No. 584,466
Int. Cl. H04b 1/16
U.S. Cl. 325—490 10 Claims

ABSTRACT OF THE DISCLOSURE

A preselector stage of a VHF-UHF television tuner with a substantially constant bandwidth over the entiré tuning range. The preselector is comprised of an adjustable parallel resonant circuit, comprising a variable inductance and a fixed capacitance, with a first impedance coupling the resonant circuit to a signal supplying means, such as an antenna, and a second impedance coupling the resonant circuit to a signal utilization means, such as a television circuit. The two coupling impedance vary inversely with respect to each other and in accordance with variations in the resonant frequency of the adjustable parallel resonant circuit to maintain the loading on the resonant circuit substantially constant over the frequency band of the tuner, thereby maintaining the tunable bandwidth substantially constant over the frequency band.

Figure 1:
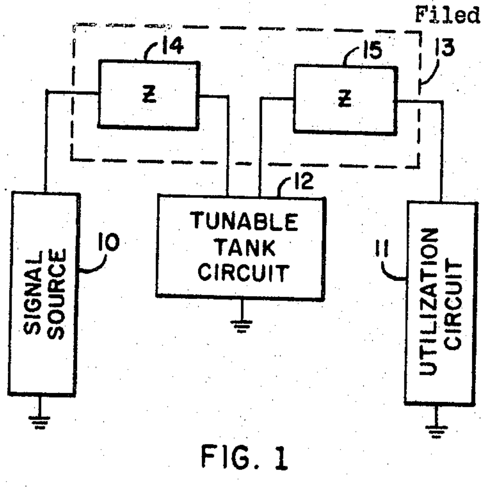

The present invention relates to electrical apparatus having a tunable bandwidth which remains relatively constant over a predetermined tuning range.

In many instances it would be advantageous to have electrical apparatus which is capable of being tuned over a predetermined frequency band, yet wherein the tunable bandwidth of the apparatus remains relatively constant over the entire tuning range. Such apparatus would be particularly useful, for example, as a preselector stage coupled between the antenna input and RF amplifier of a television tuner. However, in the case of a UHF tuner, for example, the tuning range is the entire UHF television frequency band of 470–890 mHz. (channels 14–83) while a suitable tunable bandwidth, would be a relatively narrow 12 mHz. at the 3 db points. Nevertheless, while apparatus having these characteristics would be particularly useful in television receivers, unless this apparatus is simple and economical to construct on a mass produced basis, it could not be incorporated into present day television receivers due to the highly competitive nature of this market.

It is therefore an object of the present invention to provide simplified electrical apparatus having a relatively constant tunable bandwidth over a predetermined frequency band.

It is another object of the present invention to provide simplified electrical apparatus useful as a preselector stage in a television tuner, wherein the preselector exhibits a relatively constant tunable bandwidth over the television band.

It is a further object of the present invention to provide apparatus useful as a simplified preselector stage for a combined VHF-UHF television tuner, wherein the preselector exhibits a relatively constant, narrow, tunable 3 db bandwidth over both the VHF and UHF television frequency bands.

In accordance with the present invention electrical apparatus which exhibits a relatively constant tunable bandwidth comprises means, having a first predetermined internal impedance, for supplying signals within a given frequency band; variable resonant circuit means having a resonant frequency tunable over the given frequency band, for selecting those supplied signals lying within a predetermined lesser frequency band about the resonant frequency; means, having a second internal impedance, for utilizing the selected signals and frequency dependent coupling means, coupling the resonant circuit means to the signal supply means and to the signal utilization means thereby loading the resonant circuit means, for varying the coupling to the signal supply means and to the signal utilization means inversely with respect to each other and in accordance with variations in the resonant frequency of the resonant circuit means to maintain the loading on the resonant circuit means relatively constant over the given frequency band, thereby maintaining the tunable bandwidth of the apparatus relatively constant over the given frequency band.

For a better understanding of the present invention together with other and further objects thereof, reference is had to the following description taken in connection with the accompanying drawing, and its scope will be pointed out in the appended claims.

Figure 2:
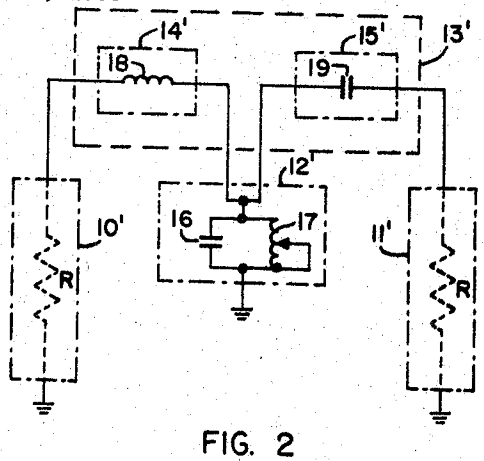
Figure 3:
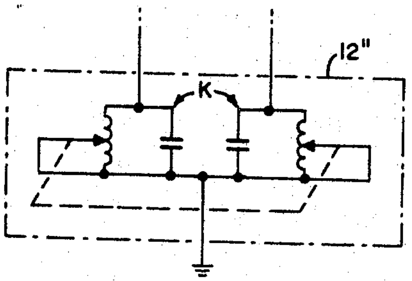
Figure 4:
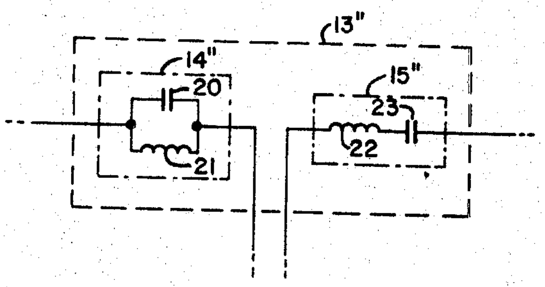
Figure 5:
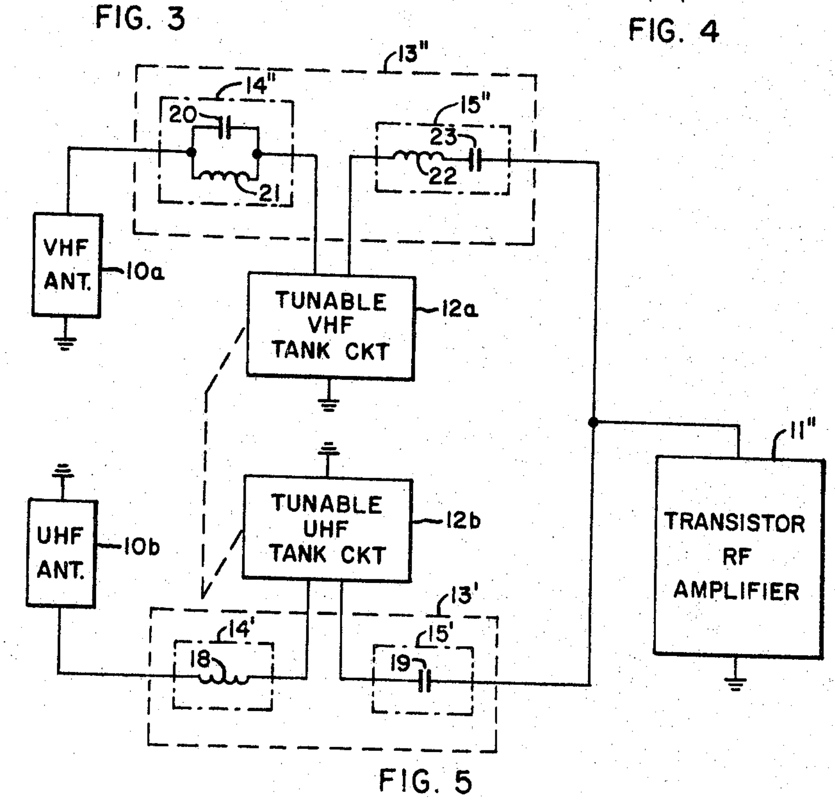

Referring to the drawing:

FIG. 1 of the drawing is a block diagram of a general embodiment of the present invention;

FIG. 2 of the drawing is a schematic diagram showing circuit details of apparatus constructed in accordance with the embodiment of FIG. 1;

FIG. 3 of the drawing is a schematic diagram of an alternative tunable tank circuit useful in the embodiment of FIG. 1 or 2;

FIG. 4 of the drawing is a schematic diagram of an alternative frequency dependent coupling means useful in the embodiments of FIG. 1 or 2, and FIG. 5 of the drawing is a circuit diagram illustrating a preselector stage constructed in accordance with one form of the present invention and suitable for use in a combined UHF-VHF television tuner.

DESCRIPTION OF THE APPARTUS OF FIG. 1

The block diagram of FIG. 1 depicts a general embodiment of the invention which will aid in understanding its basic aspects. Included in the apparatus of FIG. 1 is a signal source 10, having a first predetermined internal impedance for supplying signals within a given frequency band. Also included in the apparatus of FIG. 1 is a variable resonant circuit means, which in this instance is a tunable tank circuit 12, having a resonant frequency tunable over the given frequency band, for selecting only those supplied signals lying within a predetermined lesser frequency band about the resonant frequency. Additional, there is included in the apparatus of FIG. 1 a signal utilization circuit 11, having a second internal impedance, for utilizing the signals selected by tunable tank circiut 12.

There is finally included in the apparatus of FIG. 1, a frequency dependent coupling means, consisting of the components within the dotted box 13, coupling tank circuit 12 to signal source 10 and to signal utilization circuit 11 thereby loading tank circuit 12, for varying the coupling to signal source 10 and to signal utilization circuit 11 inversely with respect to each other and in accordance with variations in the resonant frequency of tank circuit 12 to maintain the loading on the tank circuit relatively constant over the given frequency band, thereby maintaining the tunable bandwidth of the apparatus relatively constant over the given frequency band. As shown in FIG. 1, coupling means 13 consists of a first impedance 14 connected between signal source 10 and an input of tank circuit 12, and also a second impedance 15 connected between tank circuit 12 and the signal utilization circuit 11. In accordance with the invention, impedances 14 and 15 are complementary impedances. That is, for example, as the resonant frequency of tank circuit 12 is tuned to a higher frequency within the given frequency band, this increase in resonant frequency causes the effective impedance of first impedance 14 to decrease, while causing a reciprocal effect with respect to second impedance 15, that is, causing the effective impedance of second impedance 15 to increase. The converse of this is likewise true. As the resonant frequency of tank circuit 12 is tuned to a lower frequency, the effective impedance of first impedance 14 increases, while at the same time, the effective impedance of second impedance 15 decreases.

In the apparatus of FIG. 1, the combination of the impedances of coupling means 13 and the internal impedances of signal source 10 and utilization circuit 11 constitute an overall load for tank circuit 12. As is well known, the load presented to a tunable tank circuit will determine the over-all tunable bandwidth. Likewise, in FIG. 1 the aforementioned loading on tank circuit 12 determines the over-all tunable bandwidth of the apparatus of FIG. 1. By tunable bandwidth here it is meant the 3 db tunable bandwidth of the aforementioned lesser frequency band as would be measured, for example, at the utilization circuit 11. In order to maintain a relatively constant tunable bandwidth as tank circuit 12 is tuned over the aforementioned given frequency band, it will be seen that the load presented to tank circuit 12 must be maintained at a relatively constant value. This is obtained with the present invention by inverse variation of complementary impedances 14 and 15 in accordance with variations in the resonant frequency of tank circuit 12. Since impedances 14 and 15 are complementary impedances, as the resonant frequency of tank circuit 12 is increased, for example, the coupling between tank circuit 12 and signal source 10 will decrease and the coupling between tank circuit 12 and utilization circuit 11 will increase by a corresponding amount, thus maintaining the loading on the tank circuit relatively constant, resulting in the tunable bandwidth remaining relatively constant over the entire given frequency band.

The invention will be better understood by reference to the particular embodiment of FIG. 2, where suitable circuit components are shown in place of the individual blocks of the block diagram of FIG. 1. Elements in FIG. 2 which correspond to the individual blocks of FIG. 1 are given the same number primed. For illustrative purposes only, in the embodiment of FIG. 2 it is assumed that the internal impedances of signal source 10' and of utilization circuit 11' are purely resistive and that these resistive impedances are equal.

In the embodiment of FIG. 2 there is shown a suitable arrangement for the tunable tank circuit 12' consisting of a fixed capacitor 16 in parallel with a variable inductor 17. Variation of the resonant frequency of tank circuit 12' is achieved by movement of the wiper arm of variable inductor 17.

Finally, in the embodiment of FIG. 2 the complementary impedances 14' and 15' are shown as being provided by an inductor 18 and capacitor 19, respectively, so that in this case, the complementary impedances 14' and 15' are actually complementary reactances. It will be recognized that inductor 18 and capacitor 19 may be interchanged without affecting the operation of the embodiment of FIG. 2.

In order to better understand the operation of the embodiment of FIG. 2, the apparatus will be considered as being a preselector stage in the UHF tuner of a television receiver, in which case signal source 10' may be considered as being a conventional UHF television antenna, signal utilization circuit 11' may be considered as being a conventional transistor RF amplifier, and the aforementioned given frequency band may be considered as being the UHF television band covering 470–890 mHz. In the present example, the components of tank circuit 12' are selected such that its resonant frequency is tunable over the UHF television band, so that the tank circuit selects only those supplied television signals lying within a predetermined lesser frequency band of approximately 12 mHz. bandwidth, for example, about the resonant frequency. It will be recognized that the selection function performed by tank circuit 12' is achieved by the well known means of the frequency vs. amplitude characteristic of the parallel resonant circuit, such that signals of a frequency lying within the aforementioned predetermined lesser frequency band are developed across tank circuit 12' while frequencies lying outside this lesser frequency band are substantially attenuated by tank circuit 12', thus accomplishing the selection function.

In the embodiment of FIG. 2 inductor 18 and capacitor 19 are chosen to provide approximately equal reactances at the mean frequency of the UHF band, or approximately 647 mHz. In operation, assuming that the resonant frequency of tank circuit 12' is adjusted toward the lower end of the UHF frequency band from the aforementioned mean frequency, it will be seen that the reactance of inductor 18 decreases, while the reactance of capacitor 19 increases by a corresponding amount. This action increases the coupling between resonant circuit 12' and signal source 10' while decreasing the coupling between tank circuit 12' and signal utilization circuit 11' by a corresponding amount, thus keeping the over-all loading on tank circuit 12' approximately constant as the resonant frequency of tank circuit 12' is varied. Likewise, if the resonant frequency of tank circuit 12' is adjusted toward the high end of the UHF band, the converse will occur. That is, the reactance of capacitor 19 will decrease while the reactance of inductor 18 will increase by a corresponding amount, thereby again maintaining the over-all loading on tank circuit 12' approximately constant. Hence, through the use of the complementary reactances 18 and 19, which vary inversely with respect to one another as the resonant frequency of tank circuit 12' is varied over the UHF television frequency band, it is possible to maintain a relatively constant loading on tank circuit 12' thereby maintaining a relatively constant tunable bandwidth over the entire UHF television band for the apparatus of FIG. 2.

While in the embodiment of FIG. 2 the tank circuit is shown as being of the single-tuned variety it will be recognized that the tank circuit can also be of the double-tuned variety shown in FIG. 3. The circuit of FIG. 3 is of course more expensive in that it requires additional components, however, if expense is not a factor being considered, the circuit of FIG. 3 may be used to provide additional selectivity, but will operate otherwise in the same manner as the single-tuned tank circuit shown in FIG. 2.

In the embodiment of FIG. 2 it was assumed that the given frequency band over which tank circuit 12' was capable of being tuned was the UHF television band. It will be recognized, however, that the invention is not limited to use in this single frequency band, but with appropriate and obvious modification is useful in a wide variety of frequency bands. For example, in FIG. 4 there is shown a suitable frequency dependent coupling means 13'', which may be substituted in place of the circuit 13' in FIG. 2, for use where the given frequency band is the VHF television band comprising the two separate bands of 54–88 mHz., which will be hereinafter referred to as the low VHF (LVHF) band, and 174–217 mHz., which will be hereinafter referred to as the high VHF (HVHF) frequency band.

In the embodiment of FIG. 4 the complementary impedances 14'' and 15'' each consist of a resonant circuit. Impedance 14'' consists of a parallel resonant circuit comprising a capacitor 20 shunted with an inductor 21, while the complementary impedance 15'' consists of a series of resonant circuit comprising an inductor 22 in series with a capacitor 23. In the embodiment of FIG. 4 the components which make up the complementary impedances 14'' and 15'' are selected so that each of the resonant circuits resonates at a frequency which is approximately the geometric mean between the aforementioned LVHF and HVHF frequency bands, or approximately 123.7 mHz.

That is, capacitor 20 and inductor 21 are chosen to provide parallel resonance at this frequency, while inductor 22 and capacitor 23 are chosen to provide series resonance at this frequency. This being the case, it will be appreciated that as the resonant frequency of tank circuit 12' is adjusted toward the lower end of the LVHF band, the impedance of the parallel combination 20, 21 becomes primarily inductive while the impedance of the series combination 22, 23 becomes primarily capacitive. Hence, as the resonant frequency of tank circuit 12' is decreased within the LVHF band, impedance 14'' decreases while complementary impedance 15'' increases by a corresponding amount, thus achieving a relatively constant loading on the tunable tank circuit. The converse is also true for as the resonant frequency of tank circuit 12' is adjusted toward the high end of the HVHF band, the impedance of the parallel combination 20, 21 becomes primarily capacitive, while the impedance of the series combination 22, 23 becomes primarily inductive. Thus, as the resonant frequency of tank circuit 12' is increased toward the upper end of the HVHF band, impedance 14'' increases while impedance 15'' decreases by a corresponding amount, thus again achieving a relatively constant loading on the tunable tank circuit within the HVHF band. It will be seen, therefore, that using the frequency dependent coupling means 13'' of FIG. 4 in a preselector stage constructed in accordance with the apparatus shown in FIG. 1, a relatively constant tunable bandwidth can be obtained over the entire VHF television frequency band by simply dividing this band into its HVHF and LVHF components.

In FIG. 5 of the drawings there is shown a particularly advantageous, circuit arrangement which combines the separate embodiments previously described with reference to FIGS. 2 and 4. In the circuit arrangement of FIG. 5 the embodiments of FIGS. 2 and 4 are combined to provide a unique preselector stage suitable for use in a combination VHF–UHF television tuner. In the embodiment of FIG. 5, the element **10*a*, 12*a*, 13'' and 11'' correspond to the embodiment described in relation to FIG. 4, while the combination of components 10*b*, 12*b*, 13' and 11'' correspond to the embodiment described in relation to FIG. 2. In the case of the embodiment of FIG. 5, signal source 10*a* is shown as being a conventional VHF television antenna while signal source 10*b* is shown as being a conventional UHF television antenna. Finally, signal utilization circuit 11'' is shown as being a conventional transistor RF amplifier, which in the case of a television tuner could in turn supply, for example, an interstage network feeding a mixer. Additionally, the tuning elements of the two tank circuits are mechanically coupled so that the tuning element of the UHF tank is disengaged while VHF tuning is taking place, and conversely, the VHF tuning element is disengaged while UHF tuning is taking place. Correspondingly, tunable tank circuit 12*a* is tunable over the VHF television frequency band, while tunable tank circuit 12*b*** is tunable over the UHF television frequency band.

The VHF portion of the embodiment of FIG. 5 operates in the same manner as was described previously with reference to FIG. 4, while the UHF portion of the embodiment of FIG. 5 operates in the same manner as was described previously with reference to FIG. 2. The fact that the transistor RF amplifier serves as a common signal utilization circuit for both UHF and VHF does not give rise to any problem due to a unique aspect of the circuits. This can best be seen by noting that during VHF operation, for example, while tank circuit **12*a* is being tuned over the VHF band, capacitor 19 within frequency dependent coupling means 13' presents a realtively high impedance for VHF frequencies, thus serving to isolate the UHF circuitry from the transistor RF amplifier and from the VHF circuitry. Similarly, during UHF operation the series combination of inductor 22 and capacitor 23 within coupling means 13'' presents a primarily inductive impedance for UHF frequencies and therefore acts as an RF choke for UHF, isolating the VHF circuitry from the transistor RF amplifier 11''** and from the UHF circuitry. Hence, the embodiment of FIG. 5 not only provides a preselector stage having a relatively constant tunable bandwidth over both the UHF and VHF frequency bands, but also provides automatic isolation of the VHF circuitry from the UHF circuitry during UHF operation and automatic isolation of the UHF circuitry from the VHF circuitry during VHF operation.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. Electrical apparatus which exhibits a substantially constant tunable bandwidth, comprising:

means having a first predetermined internal impedance for supplying signal within a given frequency band;

variable resonant circuit means, including an adjustable parallel resonant circuit having a fixed capacitance and a variable inductance and having a resonant frequency which is tunable over said given frequency band by adjustment of a variable inductance therein, for selecting those supplied signals lying within a predetermined lesser frequency band about said resonant frequency;

means having a second internal impedance, for utilizing said selected signals; and frequency dependent coupling means, including a pair of impedances, one impedance of said pair coupling said parallel resonant circuit to said signal supply means and the other impedance of said pair coupling said parallel resonant circuit to said signal utilization means, thereby loading said adjustable parallel resonant circuit for automatically varying the amount of coupling to said signal supply means and the amount of coupling to said signal utilization means inversely with respect to each other and in accordance with variations in the resonant frequency of said adjustable parallel resonant circuit to maintain the loading on said adjustable parallel resonant circuit substantially constant over said given frequency band, thereby maintaining the tunable bandwidth of said apparatus substantially constant over said given frequency band.

2. Electrical apparatus in accordance with claim 1 wherein said pair of impedances included within said frequency dependent coupling means comprises third and fourth complementary impedances, said third impedance being connected between said adjustable parallel resonant circuit and said signal supply means, and said fourth impedance being connected between said adjustable parallel resonant circuit and said signal utilization means whereby as the resonant frequency of said adjustable parallel resonant circuit is varied, the impedances of said third and fourth complementary impedances vary inversely with respect to each other.

3. Electrical apparatus in accordance with claim 2 wherein said third impedance is an inductance and said fourth impedance a capacitance.

4. Electrical apparatus in accordance with claim 2, wherein said given frequency band includes two desired frequency bands separated from one another by a third undesired frequency band, and wherein said third impedance is the parallel resonant combination of a capacitance and an inductance having a resonant frequency selected to lie within said undesired frequency band, and wherein said fourth impedance is the series resonant combination of a capacitance and an inductance having substantially the same resonant frequency as the parallel resonant combination of said third impedance and wherein said frequency dependent coupling means maintains the loading on said adjustable resonant circuit substantially constant over said two desired frequency bands, thereby maintaining the tunable bandwidth of said apparatus substantially constant over said two desired frequency bands.

5. Electrical apparatus in accordance with claim 2, wherein one side of said parallel resonant circuit is coupled to ground.

6. In a television receiver, preselector apparatus which exhibits a substantially constant tunable bandwidth, comprising:

a television antenna, having a first predetermined internal impedance, for supplying radio frequency signals within a given television band;

variable resonant circuit means, including an adjustable parallel resonant circuit having a resonant frequency which is tunable over said television band by adjustment of a variable inductance therein, for selecting those supplied signals lying within a predetermined lesser frequency band about said resonant frequency;

a radio frequency amplifier, having a second internal impedance, for utilizing said selected signals; and frequency dependent coupling means, including a pair of impedances coupling said resonant circuit means to said television antenna and to said radio frequency amplifier, respectively, thereby loading said adjustable parallel resonant circuit, for automatically varying the amount of coupling to said antenna and the amount of coupling to said amplifier inversely with respect to each other and in accordance with variations in the resonant frequency of said adjustable parallel resonant circuit to maintain the loading on said adjustable parallel resonant circuit substantially constant over said television band, thereby maintaining the tunable bandwidth of said apparatus substantially constant over said television band.

7. Electrical apparatus in accordance with claim 6 wherein said frequency dependent coupling means comprises third and fourth complementary impedances, said third impedance being connected between said adjustable parallel resonant circuit and said signal supply means, and said fourth impedance being connected between said adjustable parallel resonant circuit and said signal utilization means, whereby as the resonant frequency of said resonant circuit means is varied, the impedances of said third and fourth complementary impedances vary inversely with respect to each other.

8. Electrical apparatus in accordance with claim 7 wherein said television antenna supplies signals within the UHF television band, and wherein said third impedance is an inductance and said fourth impedance a capacitance.

9. Electrical apparatus in accordance with claim 7, wherein said given television band includes low VHF and high VHF television bands which are separated from each other by a third undesired frequency band, and wherein said third impedance is the parallel resonant combination of a capacitance and an inductance having resonant frequency selected to lie within said undesired frequency band, and wherein said fourth impedance is the series resonant combination of a capacitance and an inductance having substantially the same resonant frequency as the parallel resonant combination of said third impedance and wherein said frequency dependent coupling means maintains the loading on said adjustable resonant circuit substantially constant over said low VHF and high VHF television bands, thereby maintaining the tunable bandwidth of said apparatus substantially constant over said low VHF and high VHF television bands within said given television band.

10. Electrical apparatus in accordance with claim 7 wherein said variable resonant circuit means comprises the parallel combination of a fixed capacitance and a variable inductance and wherein one side of said parallel combination is coupled to ground.

References Cited

UNITED STATES PATENTS

| | | | |
|---|---|---|---|
| 1,761,530 | 6/1930 | Marvel | 325—385 |
| 2,058,512 | 10/1936 | Rust et al. | 325—443 |
| 2,069,837 | 2/1937 | Koch | 325—491 X |
| 2,789,215 | 4/1957 | Yuan Pan | 325—439 |
| 3,036,212 | 5/1962 | Meyer et al. | 325—459 |
| 3,181,068 | 4/1965 | Jones | 325—436 |

KATHLEEN H. CLAFFY, Primary Examiner

C. W. JIRAUCH, Assistant Examiner

U.S. Cl. X.R.

325—458, 462, 489